United States Patent [19]
Ehmann

[11] Patent Number: 5,666,068
[45] Date of Patent: Sep. 9, 1997

[54] GTL INPUT RECEIVER WITH HYSTERESIS

[75] Inventor: Gregory E. Ehmann, Sleepy Hollow, Ill.

[73] Assignee: VLSI Technology, Inc., San Jose, Calif.

[21] Appl. No.: 552,666

[22] Filed: Nov. 3, 1995

[51] Int. Cl.$^6$ ............................................. H03K 19/0185
[52] U.S. Cl. ................................................ 326/63; 326/81
[58] Field of Search ........................................ 326/115, 121, 326/83, 86, 71, 81, 23, 24, 63; 327/205, 206

[56] References Cited

U.S. PATENT DOCUMENTS

| | | | |
|---|---|---|---|
| 3,911,289 | 10/1975 | Takemoto | 326/115 |
| 4,450,371 | 5/1984 | Bismarck | 326/83 |
| 4,535,294 | 8/1985 | Ericksen et al. | 327/58 |
| 5,216,667 | 6/1993 | Chu et al. | 370/24 |
| 5,258,661 | 11/1993 | Banker et al. | 327/205 |
| 5,283,482 | 2/1994 | Chen | 326/66 |
| 5,367,210 | 11/1994 | Lipp | 326/83 |
| 5,430,399 | 7/1995 | Wendell | 326/121 |
| 5,508,641 | 4/1996 | Appenzeller et al. | 326/113 |
| 5,550,491 | 8/1996 | Furuta | 326/115 |

OTHER PUBLICATIONS

Startin, R. A.; "Performance of Hybrid GaAs MESFET Logic"; Int. J. Electronics; Feb., 1979; vol. 46, No. 2; pp. 161–165.

*Primary Examiner*—Edward P. Westin
*Assistant Examiner*—Benjamin D. Driscoll
*Attorney, Agent, or Firm*—Patrick T. King

[57] ABSTRACT

A GTL input receiver for receiving differential GTL signals and for generating a CMOS output at a single-ended output terminal includes a comparator circuit, a current-to-voltage converter circuit, and an inverter. The comparator is formed of a first primary current steering device and a second primary current steering device. Auxiliary current steering devices are coupled to the first and second primary current steering devices for adding hysteresis by dynamically changing the ratio of the currents flowing through the first and second primary current source devices. The input receiver also includes a control circuit for selectively enabling and disabling the secondary current steering devices. As a result, the GTL input receiver has a hysteresis in the range of 50 mV to 200 mV and higher.

15 Claims, 2 Drawing Sheets

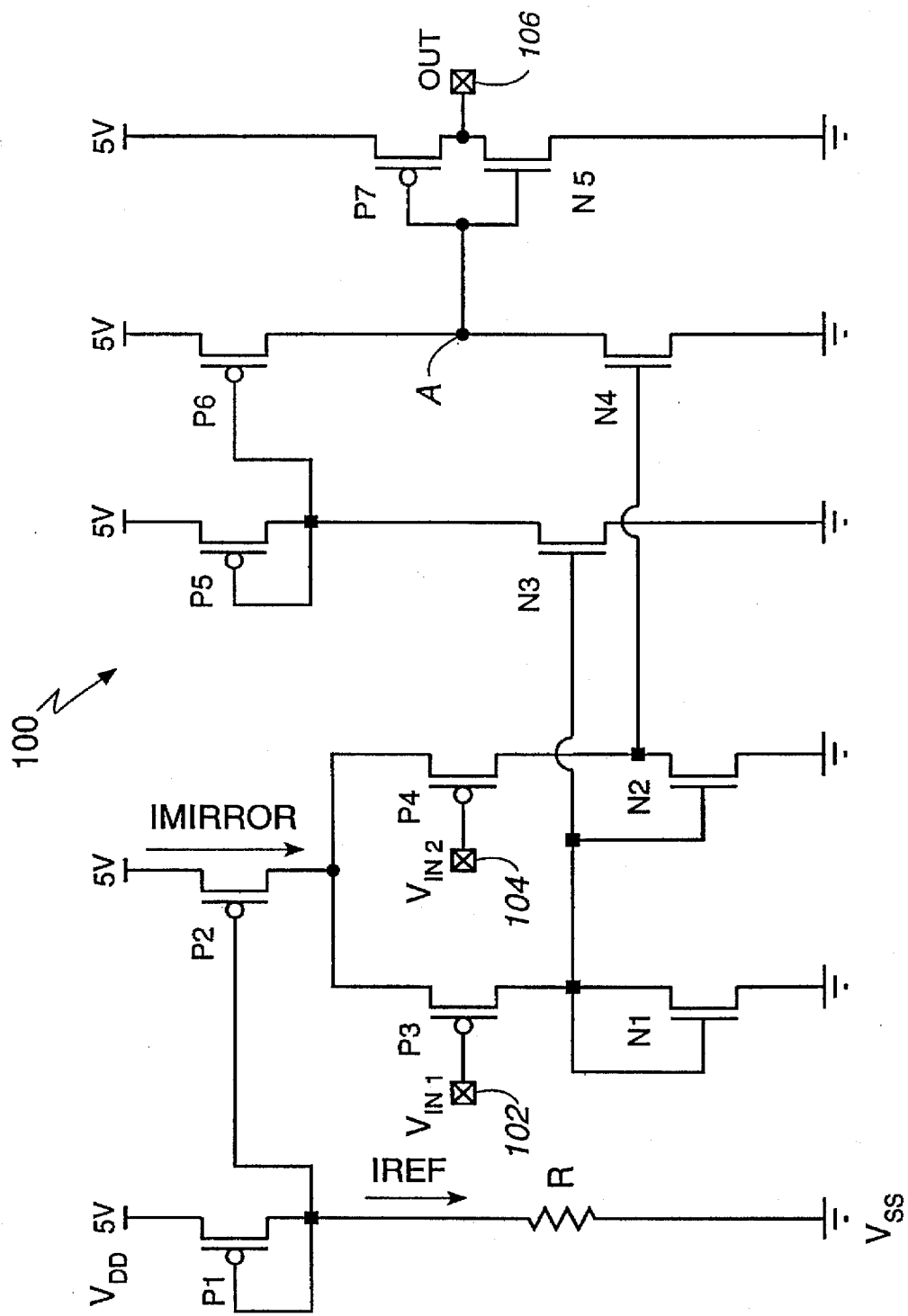
FIG._1
*(PRIOR ART)*

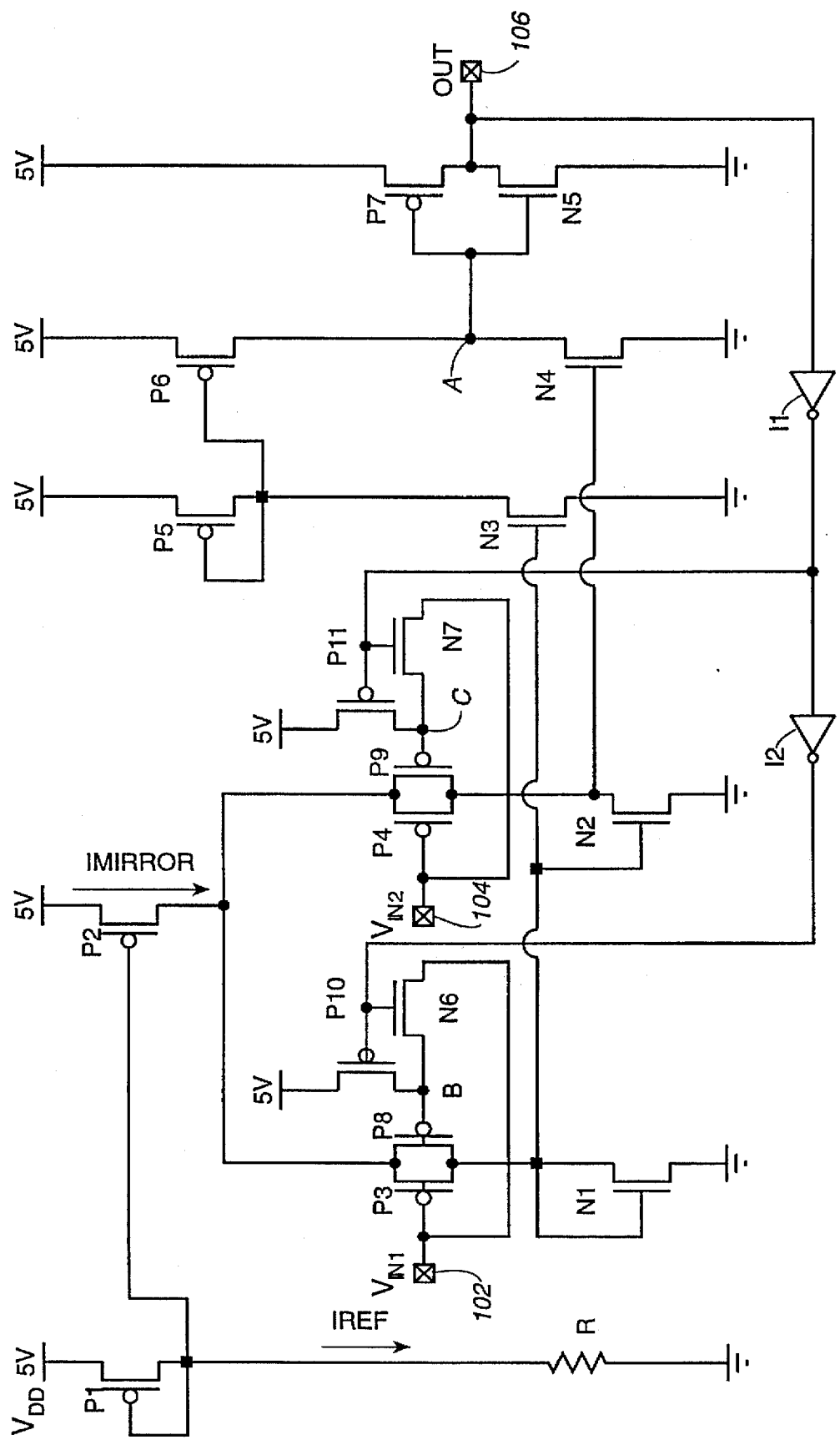
FIG._2

5,666,068

GTL INPUT RECEIVER WITH HYSTERESIS

BACKGROUND OF THE INVENTION

1. Field of the Invention

This invention relates generally to differential signal receivers with noise immunity and more particularly, it relates to an improved GTL input receiver which includes means for dynamically changing the current ratio of a pair of primary current steering devices so as to add hysteresis, thereby producing a higher margin of noise immunity.

2. Prior Art

As is generally well-known in the art of digital data communication systems, a number of data buses are typically used to transfer or communicate information among the various subsystems. Each of the data buses can be either of the unidirectional or bi-directional type. In the unidirectional type, a driver is located at one end of the data bus and a receiver is located at the other end of the data bus. In the bi-directional type, both a driver and a receiver (sometimes referred to as a "transceiver") are located at each end of the data bus. When information is transmitted over a data bus between two subsystems, it is extremely important to minimize the undesirable electrical transmission line reflection and/or noise generated when data is switched between a logic high ("1") state and a logic low ("0") state or vice-versa. In any event, it is always desirable to reduce such reflection and/or noise since it affects the net performance of the receiver.

Prior art attempts have been made heretofore so as to eliminate these factors, but they have required the necessity of redesigning of the back plane area of the digital data communication system. Further, the problems of reflections and/or noise were always unable to be completely eliminated and could only be reduced at best. As a result, the prior art arrangements still did not provide a receiver with a sufficient noise margin.

One such solution to this noise margin problem is provided in the prior art which utilizes a differential receiver in noisy environments so as to generate a high common mode rejection ratio. The common mode rejection eliminates the common noise factor which is superimposed on both inputs of the differential amplifier, but does not affect the induced noise at only an individual input. In order to overcome this deficiency, there is also known in the prior art of providing a hysteresis transfer function for the differential receiver. Once an output level has been established, small variations at the input to the receiver do not cause erroneous state changes at the output. Accordingly, the present output state will not switch to the alternate output state unless the input voltage changes to a value substantially different from the value that initiated its present state.

An example of a prior art differential receiver is a standard GTL (Gunning-Transistor-Logic) receiver 100 for receiving differential GTL signals $V_{in1}$ and $V_{in2}$ and for converting the same to a single-ended CMOS signal, as is illustrated in FIG. 1. The receiver 100 includes a reference current which is mirrored into two identical current steering transistor devices. The gates of the transistor devices are connected to input terminals for receiving the differential GTL signals. Typically, the differential GTL signals are analog signals in the range of 0.4 volts to 1.2 volts with a mid-point of 0.8 volts. Unfortunately, the input terminals of the receiver 100 are highly susceptible to noise. Thus, with a nominal input level of 0.8 volts, the noise margin of the receiver 100 is approximately 0.8 volts±less than 50 millivolts. In other words, the input hysteresis is less than 50 mV which can cause the output to switch states when the difference between the differential input signals is less than 50 mV caused by the noisy environment.

Accordingly, it would be desirable to provide an improved GTL input receiver which has a higher immunity to noise so as to provide a better performance. The GTL input receiver of the present invention represents a substantial improvement over the prior art GTL receiver of FIG. 1. The present GTL receiver includes means for dynamically changing the current ratio of a pair of primary current steering devices so as to add hysteresis, thereby increasing the noise margin.

SUMMARY OF THE INVENTION

Accordingly, it is a general object of the present invention to provide an improved GTL input receiver which has a higher immunity to noise so as to provide a better performance than those traditionally available.

It is an object of the present invention to provide an improved GTL input receiver which includes means for dynamically changing the current ratio of a pair of primary current steering devices so as to add hysteresis, thereby producing a higher margin of noise immunity.

It is another object of the present invention to provide an improved GTL input receiver which includes secondary current steering transistor devices for dynamically changing the ratio of the currents in the primary current steering devices.

It is still another object of the present invention to provide an improved GTL input receiver which includes control means responsive to an output signal for selectively enabling and disabling secondary current steering devices.

In accordance with these aims and objectives, the present invention is concerned with the provision of a GTL input receiver for receiving differential GTL signals and for generating a CMOS output at a single-ended output terminal which includes a comparator circuit formed of a first primary current steering device and a second primary current steering device. The first primary current steering device receives one of the differential GTL signals and the second primary current source device receives the other one of the differential GTL signals. A current-to-voltage converter circuit is responsive to the comparator circuit for generating a single-ended two-state output signal. The two-state output signal is in a first output state when the one of the differential GTL signals is lower than the differential GTL signals and is in a second output state when the other one of the differential GTL signals is lower than the other one of the differential GTL signals.

An inverter circuit is responsive to fie two-state output signal for generating the CMOS output which has either a high or low logic level on the output terminal. Secondary current steering devices are coupled to the first and second primary current steering devices for adding hysteresis by dynamically changing the ratio of the currents flowing through the first and second primary current source devices in response to the CMOS output in order to increase the noise margin.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a schematic circuit diagram of a standard GTL input receiver of the prior art for receiving differential GTL signals; and FIG. 2 is a schematic circuit diagram of a GTL input receiver with hysteresis, constructed in accordance with the principles of the present invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

A standard prior art GTL input receiver 100 for receiving differential GTL (Gunning-Transistor-Logic) signals $V_{in1}$ and $V_{in2}$ on respective differential input terminals 102 and 104 and for converting the same to a single-ended CMOS output on output terminal 106 is illustrated in FIG. 1. The GTL input receiver 100 includes a reference current generator formed by a P-channel transistor P1 and a resistor R for producing a constant reference current IREF. The transistor P1 has its source connected to a first power supply potential or voltage VDD, which is typically +5.0 volts. The gate and drain of the transistor P1 are connected together and to one end of the resistor R. The other end of the resistor R is connected to a second power supply potential or voltage VSS, which is typically at ground or zero volts. The P-channel transistor P1 also forms the input device in a current mirror arrangement with a P-channel transistor P2 so as to generate a current IMIRROR. The transistor P2 serves as a current source transistor for a comparator formed by a pair of identical current steering transistors P3 and P4 whose sources are connected together.

The current steering transistor P3 has its gate connected to the input terminal 102 for receiving the differential signal $V_{in1}$ and its drain connected to an N-channel load transistor N1 whose gate and drain are joined together. The source of the transistor N1 is tied to the power supply potential VSS. The current steering transistor P4 has its gate connected to the input terminal 104 for receiving the differential signal $V_{in2}$ and its drain connected to an N-channel load transistor N2. The transistor N2 has its gate connected to the gate of the transistor N1, its drain connected to the drain of the transistor P4, and its source connected to the second power supply potential VSS.

A current-to-voltage circuit is comprised of P-channel transistors P5, P6 and N-channel load transistors N3, N4. The transistor P5 has its source connected to the supply potential VDD and its gate and drain connected together and to the drain of the transistor N3. The gate of the transistor N3 is connected to the drain of the current steering transistor P3, and the source of the transistor N3 is connected to the ground potential. The transistor P6 has its source connected also to the power supply potential VDD, its gate connected to the gate of the transistor P5, and its drain connected to the drain of the transistor N4 at node A. The gate of the transistor N4 is connected to the drain of the current steering transistor P4, and the source of the transistor N4 is connected to the ground potential. It can thus be seen that the transistors N3 and N4 are driven differentially and produce a single-ended output voltage at the node A. This voltage at the node A is inverted by an inverter formed by a P-channel transistor P7 and an N-channel transistor N5 so as to produce the single-ended CMOS output signal on the output terminal 106.

The prior art GTL input receiver 100 suffers from the disadvantage that the differential GTL signals on the input terminals are highly susceptible to noise. As a result, the receiver 100 has a relatively low immunity to noise, i.e., less than 5 mV. The inventor of the present invention has developed a way to modify the receiver 100 so as to provide additional hysteresis in order to increase the noise margin to be in the range of 50 mV to 200 mV and higher, thereby providing significantly better performance.

In FIG. 2 of the drawings, there is shown a schematic circuit diagram of an improved GTL input receiver 200 with added hysteresis, constructed in accordance with the principles of the present invention. The receiver 200 includes all of the same circuit components P1–P7 and N1–N5 of the receiver 100 discussed above and further includes the additional elements of secondary or auxiliary current steering devices P8, P9; first paired control devices P10, N6; second paired control devices P11, N7; first feedback device I1; and second feedback device I2. Since the circuit components P1–P7 and N1–N5 in FIG. 2 are connected in the same identical manner as previously explained in conjunction with FIG. 1, a detailed discussion of their interconnection will not be repeated. Thus, a description of only the additional elements consisting of P-channel transistors P8–P11; N-channel transistor N6, N7; and inverters I1, I2 will now be made.

In particular, the secondary or auxiliary current steering device P8 is a P-channel transistor having its source and drain connected in parallel with the source and drain of the first primary or main current steering transistor P3 associated with the first input terminal 102. The gate of the transistor P8 is connected to a node B. When the transistor P8 is turned on, its on-resistance will be connected in parallel with the on-resistance of the transistor P3 so as to produce a resultant lower on-resistance. Similarly, the secondary or auxiliary current steering device P9 is a P-channel transistor having its source and drain connected in parallel with the source and drain of the primary or main current steering transistor P4 associated with the second input terminal 104. The gate of the transistor P9 is connected to a node C. When the transistor P9 is turned on, its on-resistance will be connected in parallel with the on-resistance of the transistor P4 so as to produce a resultant lower on-resistance.

In order to enable and disable selectively the secondary current steering transistors P8 and P9, the first paired control devices P10 and N6 are connected to the gate of the secondary current steering transistor P8 at the node B. Likewise, the second paired control devices P11 and N7 are connected to the gate of the secondary current steering transistor P9 at the node C. As will be noted, the first paired control devices is formed of the P-channel pull-up transistor P10 and the N-channel pass transistor N6. The transistor P10 has its source connected to the power supply potential VDD, its drain connected to the source of the transistor N6 at the node B, and its gate connected to the gate of the transistor N6. The drain of the transistor N6 is connected to the gate of the primary current steering transistor P3 and the first input terminal 102.

Also, the second paired control devices is formed of the P-channel pull-up transistor P11 and the N-channel pass transistor N7. The transistor P11 has its source connected to the power supply potential VDD, its drain connected to the source of the transistor N7, and its gate connected to the gate of the transistor N7 at the node C. The drain of the transistor N7 is connected to the gate of the primary current source transistor P4 and to the second input terminal 104.

The first feedback device consists of the inverter I1 having its input connected to the output terminal 106 and its output connected to the common gates of the second paired control devices P11, N7. The second feedback device consists of the inverter I2 having its input connected to the output of the inverter I1 and its output connected to the common gates of the first paired control devices P10, N6.

In the preferred embodiment, it is assumed that the differential GTL input signals $V_{in1}$ and $V_{in2}$ are analog voltages which are in the range of 0.4 volts to 1.2 volts with a mid-point of 0.8 volts. If the voltage $V_{in1}$ at the first input terminal 102 is lower than the voltage $V_{in2}$ at the second input terminal 104, the receiver 200 will provide a high logic CMOS output (+5.0 volts) on the output terminal 106. On the other hand, if the voltage $V_{in2}$ at the second input terminal 104 is lower than the voltage $V_{in1}$ on the first input terminal 102, the receiver 200 will provide a low logic CMOS output (zero volts) on the output terminal 106. The node A defines the output of the current-to-voltage converter in response to the comparator circuit for generating a single-ended two-state output signal. This two-state output signal is inverted by the inverter formed by the transistors P7 and N5.

The operation of GTL input receiver 200 will now be explained. Assume that the voltage $V_{in1}$ is lower than the voltage $V_{in2}$ so that the output terminal 106 is at a high logic level. This high logic level (+5.0 volts) is fed back to the gates of the first paired control devices P10, N6 via the inverters I1 and I2. This causes the N-channel pass transistor N6 to be turned on which allows the voltage $V_{in1}$ to be also applied to the gate of the secondary current steering transistor P8. As a result, the on-resistance's of the transistors P3 and P8 will be lower than the on-resistance of the transistor P4 and will conduct more current therethrough. This serves to add hysteresis by dynamically changing the ratio of the current flowing in the two primary current steering transistors P3 and P4 in response to the logic level at the output terminal 106.

When inverter I1 provides a low logic level (0 volts) to the gate terminals of transistor P11 and N7, P-Channel pull-up transistor P11 is turned on to provide a high voltage on the gate terminal of P-Channel transistor P11, insuring that P9 is in its off, or high resistance, state.

In this fashion, the voltages $V_{in1}$ and $V_{in2}$ must now have a greater difference before the output on the output terminal 106 is changed to the other state (low level), thus improving the noise margin. This change in the current ratio serves to reinforce and maintain the output in its present high state. With this change of the current ratio, the noise margin is increased to be between 50 mV to 200 mV.

In contrast, if it was assumed originally that the voltage $V_{in2}$ is lower than the voltage $V_{in1}$, then the output on the output terminal 106 would be at a low logic level (zero volts). This low logic level is fed back to the gates of the second paired control devices P11, N7 via the inverter I1. This causes the N-channel pass transistor N7 to be turned on which allows the voltage $V_{in2}$ to be also applied to the gate of the secondary current steering transistor P9. Consequently, the on-resistance's of the transistors P4 and P9 will now be lower than the on-resistance of the transistor P3 and will conduct more current therethrough. Pull-up transistor P10 is turned on to insure that P8 is in its off, or high resistance, state. This serves again to add hysteresis by dynamically changing the ratio of the currents flowing in the two primary current steering transistors P4 and P3 in response to the logic level at the output terminal 106.

Transistor P3 and P4 typically have gate width-to-length ratios of 112/2 while the secondary current steering transistors P8, P9 have gate width to length ratio of 40/2.

From the foregoing detailed description, it can thus be seen that the present invention provides an improved GTL input receiver which includes means for dynamically changing the current ratio of a pair of primary current steering devices so as to add hysteresis in order to produce a higher margin of noise immunity. This is accomplished in the present invention by utilizing secondary current steering devices which are coupled in parallel to the primary current steering devices. Further, there is provided control means responsive to an output signal for selectively enabling and disabling the secondary current steering devices.

What is claimed is:

1. A GTL input receiver for receiving differential GTL signals and for generating a CMOS output at a single-ended output terminal comprising:

comparator means formed of a first primary current steering device and a second primary current steering device with said first primary current steering device receiving one of said differential GTL signals and with said second primary current steering device receiving the other one of said differential GTL signals;

current-to-voltage converting means responsive to said comparator means for generating a single-ended two-state output signal, said two-state output signal being in a first output state when said one of said differential GTL signals is lower than said other one of said differential GTL signals and being in a second output state when said other one of said differential GTL signals is lower than said one of said differential GTL signals;

inverting means responsive to said two-state output signal for generating said CMOS output having either a high or low logic level on said output terminal; and auxiliary current steering means coupled to said first and second primary current steering devices for adding hysteresis by dynamically changing the ratio of the current flowing through said first and second primary current steering devices in response to said CMOS output thereby increasing the noise margin.

2. A GTL input receiver as claimed in claim 1, wherein said first primary current steering device is comprised of a first P-channel transistor and said second primary current steering device is comprised of a second P-channel transistor.

3. A GTL input receiver as claimed in claim 2, wherein said secondary currents steering means is comprised of a third P-channel transistor whose source and drain are connected in parallel with said first P-channel transistor and a fourth P-channel transistor whose source and drain are connected in parallel with said second P-channel transistor.

4. A GTL input receiver as claimed in claim 3, further comprising first control means for selectively enabling and disabling said third P-channel transistor and second control means for selectively enabling and disabling said fourth P-channel transistor.

5. A GTL input receiver as claimed in claim 4, wherein said first control means is comprised of a fifth P-channel transistor and a first N-channel transistor, said fifth P-channel transistor having its source connected to a power supply potential, its gate connected to the gate of said first N-channel transistor, and its drain connected to the source of said first N-channel transistor and to the gate of said third P-channel transistor.

6. A GTL input receiver as claimed in claim 5, wherein said second control means is comprised of a sixth P-channel transistor and a second N-channel transistor, said sixth P-channel transistor having its source connected to the power supply potential, its gate connected to the gate of said second N-channel transistor, and its drain connected to the source of said second N-channel transistor and to the gate of said fourth P-channel transistor.

7. A GTL input receiver as claimed in claim 6, further comprising feedback means for coupling the CMOS output to the gates of said sixth P-channel and second N-channel transistors and to the gates of said fifth P-channel and first N-channel transistors.

8. A GTL input receiver as claimed in claim 7, wherein said feedback means is comprised of a first inverter and a second inverter, said first inverter having its input connected to the CMOS output voltage at the output terminal and its output connected to the gates of said sixth P-channel and second N-channel transistors, said second inverter having its input connected to the output of said first inverter and its output connected to the gates of said fifth P-channel and first N-channel transistors.

9. A GTL input receiver as claimed in claim 5, wherein said fifth P-channel transistor defines a pull-up transistor and said first N-channel transistor defines a pass transistor, said first N-channel transistor being turned on when said CMOS output is at the high logic level so as to cause the on-resistance's of said first and third P-channel transistors to be lower than the on-resistance of said second P-channel transistor.

10. A GTL input receiver as claimed in claim 9, wherein said sixth P-channel transistor defines a second pull-up transistor and said second N-channel transistor defines a second pass transistor, said second N-channel transistor being turned on when said CMOS output is at the low logic level so as to cause the turn-on resistance's of the second and fourth P-channel transistors to be lower than the on-resistance of said first P-channel transistor.

11. A GTL input receiver with hysteresis to produce a higher margin of noise immunity comprising:

comparator means responsive to differential GTL input signals for generating a CMOS output at a single-ended output terminal;

said comparator means being formed of a pair of first and second main source-coupled current steering transistors, wherein said first main current steering transistor is comprised of a first P-channel transistor and said second main current steering transistor is comprised of a second P-channel transistor;

a first auxiliary current steering transistor connected in parallel with said first main current steering transistor, wherein said first auxiliary current steering transistor is comprised of a third P-channel transistor;

a second auxiliary current steering transistor connected in parallel with said second main current steering transistor, wherein said second auxiliary current steering transistor is comprised of a fourth P-channel transistor;

control means for selectively enabling one of said first and second auxiliary current steering transistors so as to add hysteresis by dynamically changing the ratio of the currents flowing through said first and second main current steering transistors, wherein said control means includes a first control means associated with said first auxiliary current steering transistor and a second control means associated with said second auxiliary control steering transistor, wherein said first control means is comprised of a fifth p-channel transistor and a first N-channel transistor, said fifth P-channel transistor having its source connected to a power supply potential its gate connected to the gate of said first N-channel transistor, and its drain connected to the source of said first N-channel transistor and to the gate of said third P-channel transistor; and feedback means responsive to said CMOS output for activating said control means.

12. A GTL input receiver as claimed in claim 11, wherein said second control means is comprised of a sixth P-channel transistor and a second N-channel transistor, said sixth P-channel transistor having its source connected to the power supply potential, its gate connected to the gate of said second N-channel transistor, and its drain connected to the source of said second N-channel transistor and to the gate of said fourth P-channel transistor.

13. A GTL input receiver as claimed in claim 11, wherein said feedback means is comprised of a first inverter and a second inverter, said first inverter having its input connected to the CMOS output voltage at the output terminal and its output connected to the gates of said sixth P-channel and second N-channel transistors, said second inverter having its input connected to the output of said first inverter and its output connected to the gates of said fifth P-channel and first N-channel transistors.

14. A GTL input receiver as claimed in claim 11, wherein said fifth P-channel transistor defines a pull-up transistor and said first N-channel transistor defines a pass transistor, said first N-channel transistor being turned on when said CMOS output is at the high logic level so as to cause the on-resistance's of said first and third P-channel transistors to be lower than the on-resistance of said second P-channel transistor.

15. A GTL input receiver as claimed in claim 14, wherein said sixth P-channel transistor defines a second pull-up transistor and said second N-channel transistor defines a second pass transistor, said second N-channel transistor being turned on when said CMOS output is at the low logic level so as to cause the turn-on resistance's of the second and fourth P-channel transistors to be lower than the on-resistance of said first P-channel transistor.

* * * * *